US006946747B1

(12) United States Patent
Mori et al.

(10) Patent No.: US 6,946,747 B1
(45) Date of Patent: Sep. 20, 2005

(54) SEMICONDUCTOR DEVICE AND ITS MANUFACTURING METHOD

(75) Inventors: Yukari Mori, Kanagawa (JP); Takayuki Ezaki, Kanagawa (JP); Teruo Hirayama, Kanagawa (JP); Naoto Sasaki, Kanagawa (JP); Hiroshi Ozaki, Saitama (JP); Natsuya Ishikawa, Kanagawa (JP)

(73) Assignee: Sony Corporation, (JP)

( * ) Notice: Subject to any disclaimer, the term of this patent is extended or adjusted under 35 U.S.C. 154(b) by 0 days.

(21) Appl. No.: 10/385,745

(22) Filed: Mar. 12, 2003

(30) Foreign Application Priority Data

| | | |
|---|---|---|
| Mar. 13, 2002 | (JP) | P2002-067969 |
| Aug. 14, 2002 | (JP) | P2002-236348 |
| Nov. 12, 2002 | (JP) | P2002-327852 |

(51) Int. Cl.7 ........................ H01L 23/48; H01L 23/52; H01L 29/40

(52) U.S. Cl. ...................... 257/786; 257/784; 257/723; 257/773; 257/778

(58) Field of Search ................................ 257/723, 780, 257/786, 773, 784, 778; 438/617, 108

(56) References Cited

U.S. PATENT DOCUMENTS 6,403,448 B1 * 6/2002 Reddy ........................ 438/460

* cited by examiner

*Primary Examiner*—Nitin Parekh
(74) *Attorney, Agent, or Firm*—Rader, Fishman & Grauer PLLC; Ronald P. Kananen

(57) ABSTRACT

A semiconductor device of the MCM type capable of high-speed operation and low power consumption and its manufacturing method are provided. A plurality of semiconductor chips, each having an internal circuit as well as an external connection circuit drawn from the internal circuit, are mounted on the same supporting substrate of this semiconductor device. Semiconductor chips are connected with each other, not by way of the external connection circuits, but directly at a portion between the internal circuits through wiring. This wiring is patterned on an insulating film provided on the supporting substrate and covers the semiconductor chips. Accordingly, through connection holes formed on the insulating film, connection can be established to the internal circuits or the wiring can be formed on the supporting substrate side. If the wiring is formed on the supporting substrate side, the semiconductor chips are to be mounted facing down relative to the supporting substrate.

2 Claims, 12 Drawing Sheets

SEMICONDUCTOR DEVICE AND ITS MANUFACTURING METHOD

CROSS REFERENCES TO RELATED APPLICATIONS

The present document is based on Japanese Priority Documents JP 2002-067969, JP 2002-236348 and JP 2002-327852, filed in the Japanese-Patent Office on March 13, August 14 and Nov. 12, 2002, respectively, the entire contents of which being incorporated herein by reference.

BACKGROUND OF THE INVENTION

1. Field of the Invention

The present invention relates to a semiconductor device and its manufacturing method, and, more particularly, to a semiconductor device subjected to the application of so-called multi-chip module techniques, in which a plurality of semiconductor chips are incorporated as one electronic component, and its manufacturing method.

2. Description of the Related Art

To meet the demands of miniaturized lightweight, and low-energy consumption electric and electrical products, together with the high integration technology of semiconductor chips, packaging techniques to mount these semiconductor chips in high density have also been developed. Among such packaging techniques, multi-chip module (hereinafter referred to as "MCM") techniques, in which a plurality of semiconductor chips are mounted as one electrode component on the same supporting substrate and pre-packaged, have been developed to bring about even higher density packaging, in addition to multi-layer wiring supporting substrates, bear-chip packaging, and the like. By building more than two semiconductor chips on a single substrate, the MCM techniques practically realize multi-functionality.

Referring to FIG. 13, this is a plan view of an example of a semiconductor device using such an MCM technique. A semiconductor device illustrated herein is constituted with two semiconductor chips 102 and 103 having divergent functions mounted on a supporting substrate 101. On each of the semiconductor chips 102 and 103, there are installed internal circuits 102*a* and 103*a* in which respective functional chips are formed; external connection circuits (so-called interface circuits) 102*b* and 103*b* drawn from these internal circuits 102*a* and 103*a*; and electrode pads 102*c* and 103*c* connected to the external connection circuits 102*b* and 103*b*. Moreover, the semiconductor chips 102 and 103 are connected to each other with wiring 104 set up between the electrode pads 102*c* and 103*c*.

A semiconductor device of the MCM type mentioned above, in comparison with a semiconductor device of the LSI system type having a plurality of semiconductor chips built in, realizes the same degree of high functionality while simplifying design and wafer processes, hence, it is advantageous in terms of yield, production cost, and shortened TAT (Turn Around Time).

In each semiconductor device of the MCM type mentioned above, FIG. 13 is presented as an example to describe that the connection between the semiconductor chip 102 and the semiconductor chip 103 is established by way of the external connection circuits 102*b* and 103*b*. These external connection circuits 102*b* and 103*b* are necessary for testing the internal circuits 102*a* and 103*a* regarding respective semiconductor chips 102 and 103. For example, each of the external connection circuits comprises an I/O interface circuit, a power circuit, an electrostatic protective circuit, and the like.

Since each of these circuits requires a very substantial quantity of current, an increase in power consumption of the entire semiconductor device is caused. Such increase in power consumption leads to increasing calorific power in the semiconductor device, which in turn leads to deterioration of its reliability.

Further, connecting between the semiconductor chips 2 and 3 via the I/O circuit makes high-speed operation difficult.

In view of these problems, the present invention meets a need to provide a semiconductor device of the MCM type capable of high-speed operation and low power consumption and its manufacturing method.

SUMMARY OF THE PRESENT INVENTION

A semiconductor device according to the present invention for meeting such a need is a semiconductor device having a plurality of semiconductor chips provided with an internal circuit and an external connection circuit drawn from the internal circuit mounted on a same supporting substrate. These semiconductor chips are directly connected at a portion between the internal circuits thereof and not via the external connection circuit.

In the semiconductor device of such a construction, because direct connection at the portion between the internal circuits of the semiconductor chips is established, in comparison with a case of connecting the internal circuits of the semiconductor chips via the external connection circuits thereof, power consumption in the external connection circuits is prevented, while, at the same time, operating delay between the semiconductor chips due to connection via the external connection circuits can be prevented.

Especially, by electrically cutting off the external connection circuits, which are drawn from the internal circuit connected to the other semiconductor chips, from the internal circuit, power supply to the cut off external connection circuits is stopped, hence, in the above-mentioned comparison, a further effect of preventing power consumption in the external connection circuits will become greater. A switch circuit for performing cut-off operation may be installed in each semiconductor chip.

Further, in a manufacturing method of a semiconductor device according to the present invention, a functional test of the internal circuits formed on a plurality of semiconductor chips is conducted via the external connection circuit formed on each of the semiconductor chips. This is followed by such processes as a process of mounting each semiconductor chip on the same supporting substrate, a process of electrically cutting off a part of the external connection circuit in each semiconductor chip from the internal circuit, and a process of connecting each semiconductor chip without going through the external connection circuit but directly at a portion of the internal circuit.

In such a manufacturing method, after the internal circuit functional test is performed using a sufficient number of necessary pieces of the external connection circuits, connection between these semiconductor chips is established at a portion between the internal circuits. Consequently, there is manufactured a semiconductor device in which, by using semiconductor chips whose reliability is sufficiently assured by the functional test, semiconductor chips are connected at the portions of the internal circuits without going through the external connection circuits used in the functional test.

Further, in this manufacturing method, after the functional test, there is performed the process of electrically cutting off a part of the external connection circuit from the internal circuit. Although the external connection circuits are necessary to carry out the inspection test of the internal circuits, they are not needed when an internal circuit is directly connected to an internal circuit of the other semiconductor chip. What is obtained then is a semiconductor device in which no power is supplied to its external connection circuits.

As mentioned above, according to a semiconductor device of the present invention, by connecting directly between the portions of the internal circuits, while preventing power consumption in the external connection circuits, it becomes possible to prevent operating delay between the semiconductor chips otherwise caused by going through the external connection circuits, and thus it becomes possible to accomplish high-speed operation and low power consumption in a semiconductor device of the MCM type.

Further, according to a manufacturing method of a semiconductor device of the present invention, after completing the functional test of the internal circuits by using a sufficient number of the necessary external connection circuits, there is employed a construction in which direct connection is established between the semiconductor chips through the portions of the internal circuits. This makes it possible to obtain a semiconductor device having the semiconductor chips directly connected with the portions of the internal circuits without going through the external connection circuits used for the functional test while utilizing those semiconductor chips whose full reliability has been assured by the functional test.

Consequently, by using those semiconductor chips whose reliability has been assured, it becomes possible to obtain a semiconductor device of the MCM type which prevents extra power consumption in the external connection circuits as well as operating delay between the semiconductor chips otherwise caused by going through the external connections circuits.

BRIEF DESCRIPTION OF THE DRAWINGS

For a better understanding of the present invention as well as other objects and advantages, reference is made to the following detailed description in conjunction with the accompanying drawings, wherein.

DETAILED DESCRIPTION OF THE PREFERRED EMBODIMENTS

Embodiments according to the present invention will now be described in detail below with reference to the accompanying drawings. For the similar element in each embodiment, the same numeral is given, and duplicate explanations thereof will be omitted.

First Preferred Embodiment

Figure 1:
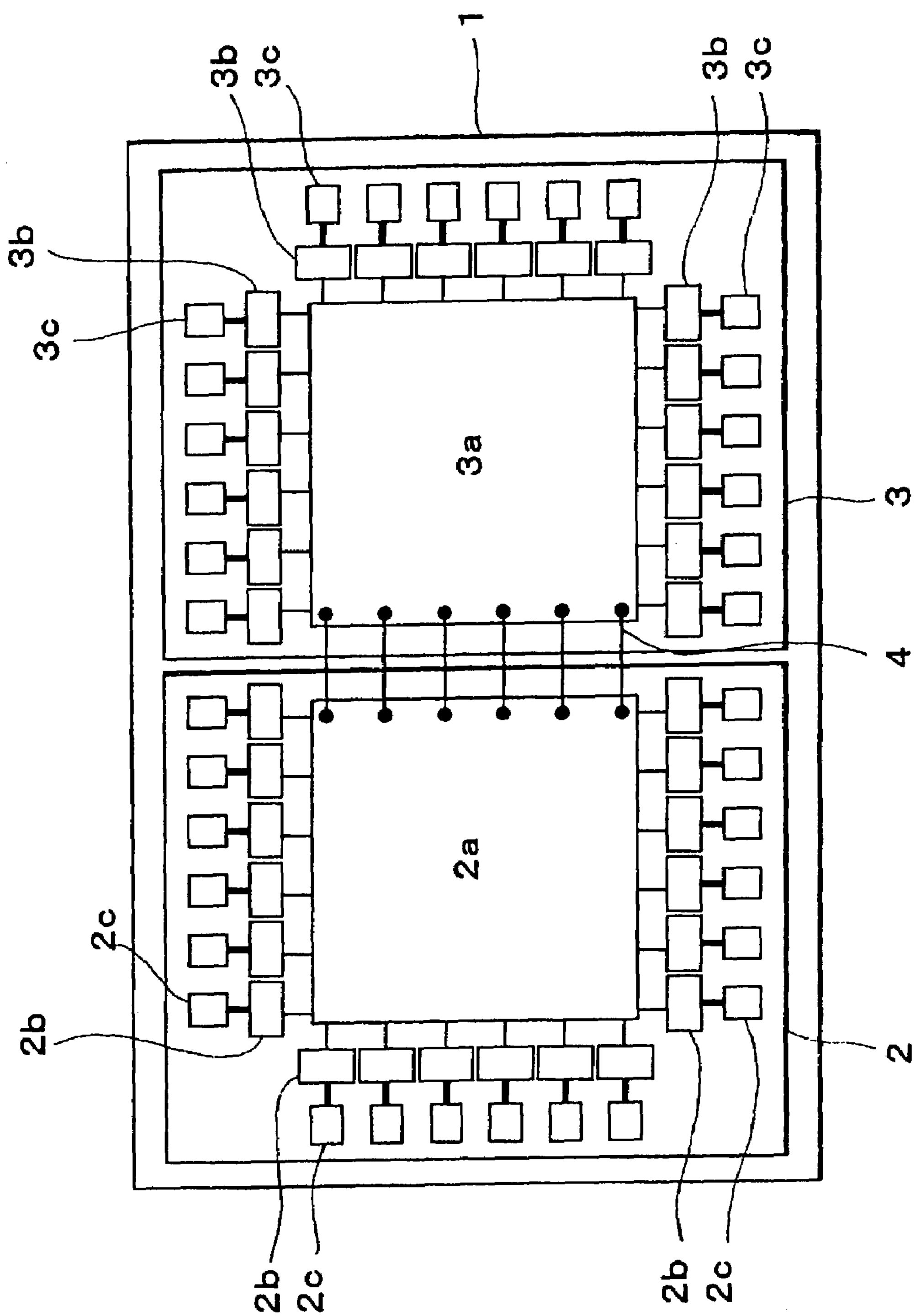
FIG. 1 is a plan view showing a construction of a semiconductor device according to a first embodiment of the present invention.

FIG. 1 is a plan view showing a first preferred embodiment of a semiconductor device according to the present invention.

The semiconductor device shown in this drawing is a semiconductor device of the so-called MCM type with a plurality of (two as illustrated) semiconductor chips 2 and 3 mounted on a supporting substrate 1.

The semiconductor chip 2 is a semiconductor chip for logic in which, as an internal circuit 2*a*, for example, a logic circuit for signal processing and a signal control circuit for reading an optical disk are formed. On the other hand, the semiconductor chip 3 is a semiconductor chip for memory in which as an internal circuit 3*a*, for example, a 32-bit, bus DRAM circuit is formed.

On these semiconductor chips 2 and 3, there are installed a plurality of external connection circuits 2*b* and 3*b* drawn from respective internal circuits 2*a* and 3*a*, and electrode pads 2*c* and 3*c* connected to each of these external connection circuits 2*b* and 3*b*. Each of these external connection circuits 2*b* and 3*b* comprises, for example, an I/O circuit, a power circuit, an electrostatic protection circuit, and the like. As an example, its construction is shown in a circuit diagram in FIG. 2. Further, the electrode pads 2*c* and 3*c* are provided for connecting a semiconductor device mounted with these semiconductor chips 2 and 3 to external equipment. For example, as shown in FIG. 1, they are placed along the outer periphery of the supporting substrate 1.

Figure 3:
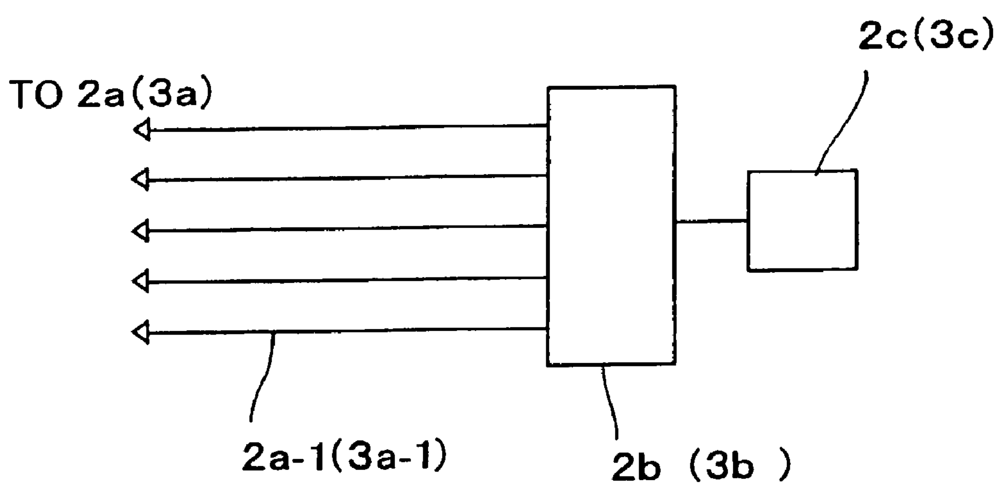
FIG. 3 is a diagram showing an example of connection of the external connection circuit relative to an internal circuit.

As shown in FIG. 3, each external connection circuit 2*b*(3*b*) and the electrode pad 2*c* (3*c*) may be so constructed as to be shared by a plurality of (five lines as illustrated) signal lines 2*a*-1 (3*a*-1) drawing the internal circuits 2*a* (3*a*). In this case, the construction is such that the I/O circuit performs processing in which the external circuit 2*b* (3*b*) stores a signal from the internal circuit 2*a* (3*a*), applies serial signal processing thereto, sends the signal to outside the chip, and applies reverse signal processing thereto to restore it to the original signal.

Semiconductor chips 2 and 3 of the above-mentioned construction are, for example, subjected to die bonding on the supporting substrate 1 with their circuit surface formed facing upward. And, an insulating film omitted in this illustration is formed on the supporting substrate 1 in a manner of covering these semiconductor chips 2 and 3.

Further, it should be noted that the connection between these semiconductor chips 2 and 3 is not by way of the electrode pads 2*c* and 3*c* and the external connection circuits 2*b* and 3*b* but by wiring 4 provided to connect mutually the internal circuits 2*a* and 3*a*. This wiring 4, for example, is disposed on the above-mentioned insulating film by patterning, through connection holes formed on the insulating film, connected to the internal circuits 2*a* and 3*a* of each of the semiconductor chips 2 and 3.

Still further, the portions of the internal circuits 2*a* and 3*a* to which the wiring 4 is connected are constituted by either forming a part of the wiring (signal line) making up the internal circuit 2*a* and 3*a* in the shape of an electrode pad or connecting each of these signal lines to an electrode pad so that a sufficient area is obtained thereby for connection.

According to a semiconductor device of the above-mentioned construction, it is so constructed as to provide a direct connection between the portions of the internal circuits 2*a* and 3*a* of the semiconductor chips 2 and 3 without going through the external connection circuits 2*b* and 3*b*. As compared with a semiconductor device in which the internal circuits 2*a* and 3*a* of the semiconductor chips 2 and 3 are connected via the external connection circuits 2*b* and 3*b*, this enables power consumption in the external connection circuits 2*b* and 3*b* to be reduced, further preventing operating delay caused by connecting between the semiconductor chips 2 and 3 via the external connection circuits 2*b* and 3*b*. As a result, it is possible to achieve high-speed operation of a semiconductor device.

Still further, it should be noted that not only is there a direct connection between the semiconductor chips 2 and 3 because of a direct connection between the portions of the internal circuits 2*a* and 3*a* of the semiconductor chips 2 and 3 without going through the external connection circuits 2*b* and 3*b*, but also no unnecessary external connection circuits are used for connection. Consequently, a current is prevented from entering such unnecessary external connection circuits, the reduction of power consumption is ensured and a semiconductor chip area for keeping the unnecessary external connection circuits can be eliminated. This contributes to the miniaturization of a semiconductor device.

Especially, as described by referring to FIG. 3, in a case where a plurality of signal lines 2*a*-1 (3*a*-*l*), with which the external connection circuits 2*b* and 3*b* take out the internal circuits 2*a* and 3*a*, are shared, there is considerable power consumption in the external connection circuits 2*b* and 3*b* alone. However, because such external connection circuits 2*b* and 3*b* are not provided at the connection between the internal circuits 2*a* and 3*a*, such heavy power consumption can be prevented.

Next, a manufacturing method of a semiconductor device mentioned above will be explained.

Figure 4A:
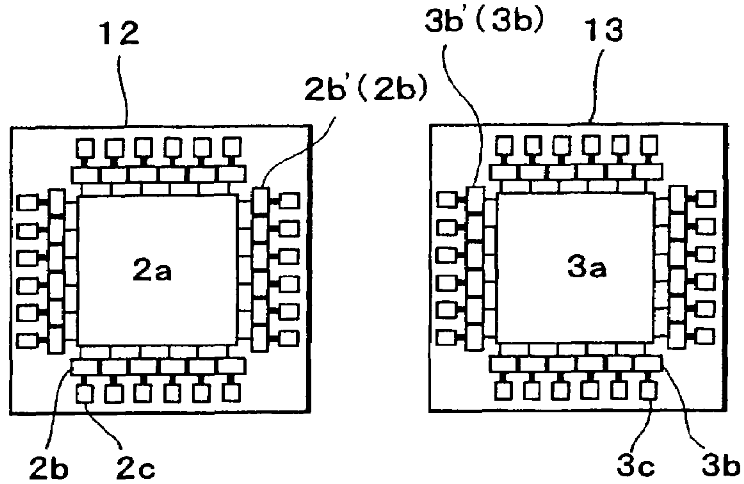
FIG. 4, consisting of FIGS. 4A, 4B, and 4C, is a process diagram showing a manufacturing method of a semiconductor device according to the first embodiment.

First, referring to FIG. 4A, semiconductor chips 12 and 13 are fabricated. These semiconductor chips 12 and 13 are respectively a prior piece of the semiconductor chips 2, 3 explained by referring to FIG. 1, in which the internal circuits 2*a* and 3*a*, the external connection circuits 2*b* and 3*b*, and the electrode pads 2*c* and 3*c* are respectively provided. Particularly, from the internal circuits 2*a* and 3*a*, a sufficient number of pieces of the external connection circuits 2*b* and 3*b* to carry out a functional test of the internal circuits 2*a* and 3*a* are to be drawn out. Therefore, the number of the external connection circuits 2*b* and 3*b* of the semiconductor chips 12 and 13 as well as the number of pieces the electrode pads 2*c* and 3*c* are more than those pieces in the semiconductor chips 2, 3 described by referring to FIG. 1.

Further, of the external connection circuits 2*b* and 3*b* which were drawn from the internal circuits 2*a* and 3*a*, those portions of the internal circuits 2*a* and 3*a* from which a part of the external connection circuits is drawn to be cut off and removed in a later process, are where the electrode pads not illustrated herein are formed. These electrode pads may be as minute as possible to carry out connection between other chips in the later process.

Figure 5:
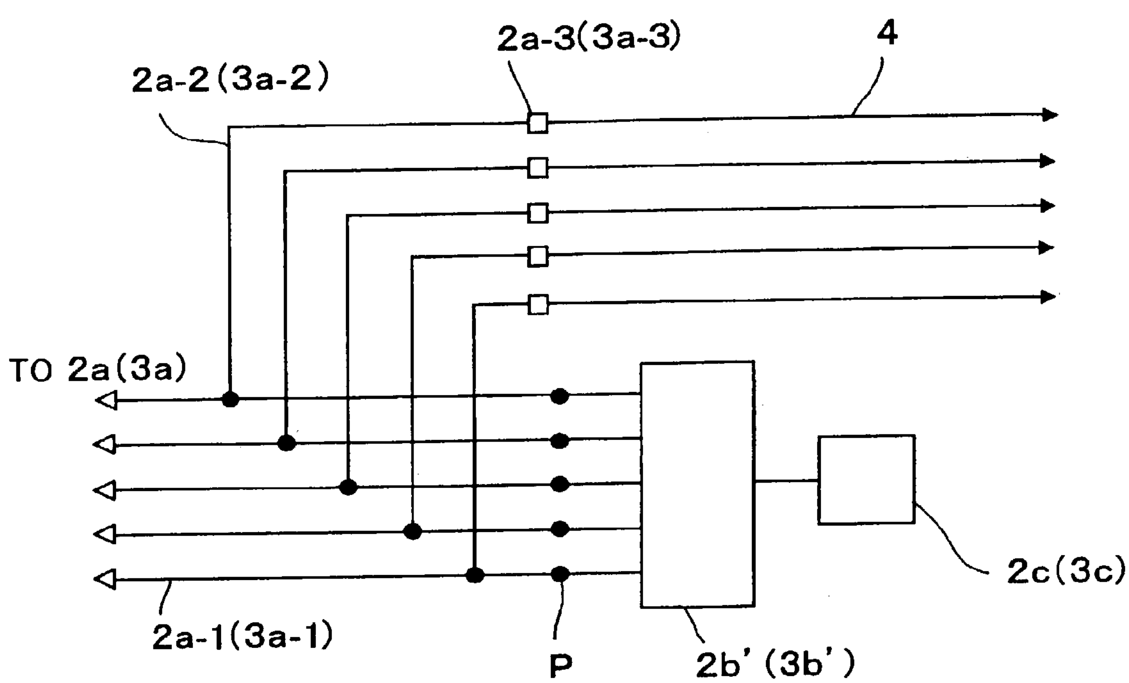
FIG. 5 is a diagram showing another example of a connection of the external connection circuit which is separated from the internal circuit.

Still further, if, as shown in FIG. 5, the part of the external connection circuits 2*b* and (3*b*') to be cut off and removed in the later process are to be shared by a plurality of signal lines 2*a*-1 (3*a*-1) in the same way as explained by referring to FIG. 3, the electrode pad 2*a*-3 (3*a*-3) is connected to each signal line 2*a*-1 (3*a*-1) via a connection line 2*a*-2 (3*a*-2). This electrode 2*a*-3 (3*a*-3) maybe, as mentioned above, minute enough to provide connection between other chips in a later process and formed as a part of the internal circuit. This electrode pad 2*a*-3 (3*a*-3) may also be set up on the signal line 2*a*-1 (3*a*-1).

Next, referring back to FIG. 4A, with regard to each of the semiconductor chips 12 and 13, a needle is pierced into each of the electrode pads 2*c* and 3*c* to conduct a functional test of the internal circuit 2*a* and 3*a*. At this instant, it is preferable that the functional test on each of the semiconductor chips 12 and 13 be conducted in the state of a wafer on which a plurality of semiconductor chips 12 are provided as well as in a state of a wafer on which a plurality of semiconductor chips 13 are provided. Then, each of the semiconductor chips 12 and 13 formed on each wafer is subjected to determination on whether it is acceptable or not. Thereafter, each wafer is ground from its backside and is split into each of the semiconductor chips 12 and 13, and only those chips determined by the result of the functional test to be acceptable are picked up.

Figure 4B:
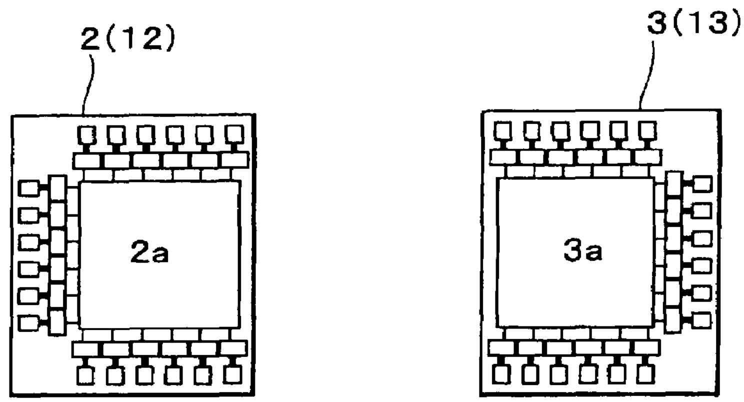

After the functional test mentioned above, as shown in FIG. 4B, a part of the external connection circuits 2*b*' and 3*b*' and another part, where electrode pads 2*c* and 3*c* are set up, in each of the semiconductor chips 12 and 13 are cut off by dicing and are removed to form the semiconductor chips 2 and 3. The external connection circuits 2*b*' and 3*b*' as well as the electrode pads 2*c* and 3*c* which are to be removed in this operation are the external connection circuits 2*b*' and 3*b*' as well as the electrode pads 2*c* and 3*c* provided in a connecting part with other semiconductor chips in the next process. Further, the cutting positions of the external connection circuits 2*b*' and 3*b*' relative to the internal circuits 2*a* and 3*a* are points P of a circuit diagram shown in FIG. 2 or FIG. 5, that is, in between the internal circuits 2*a* and 3*a* and the external connection circuits 2*b*' and 3*b*'. And as FIG. 5 shows, these positions are where the electrode pads 2*a*-3 (3*a*-3) remain on the side of the internal circuits 2*a* and 3*a*. Accordingly, the semiconductor chips 12 and 13 are formed in the condition of the semiconductors 2 and 3 of a construction explained by referring to FIG. 1.

Figure 4C:
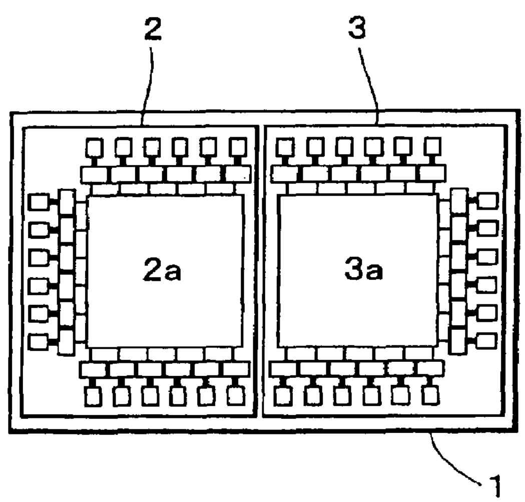

Next, referring to FIG. 4C, the semiconductor chips 2 and 3 are subjected to die bonding onto the supporting substrate 1. At this instant, it is preferable to employ a layout in which the connecting portions of each of the semiconductor chips 2 and 3 are arranged in proximity to each other.

After the above-mentioned operation, though not illustrated herein, an insulating film is formed over the supporting substrate 1 in a manner of covering these semiconductor chips 2 and 3, and further, on the insulating film are formed connection holes reaching electrode pads set up on the internal circuits 2*a* and 3*a* of each of the semiconductor chips 2 and 3.

Furthermore, by forming the wiring through the process of patterning over the insulating film in a manner of directly connecting the internal circuits 2*a* and 3*a* of each of the semiconductor chips 2 and 3 via the connection holes, there is obtained a semiconductor device illustrated in FIG. 1. For example, in a circuit construction described by referring to FIG. 5, the connection holes reaching the electrode pad 2*a*-3 (3*a*-3) are formed, and the electrode pad 2*a*-3 (3*a*-3) is connected with the wiring 4.

In a manufacturing method mentioned above, after the functional test of the internal circuits 2*a* and 3*a* is conducted by using a sufficient number of necessary pieces of the external connection circuits 2*b* and 3*b*, while unnecessary external connection circuits 2*b*' and 3*b*' are in the state of being cut off from the internal circuits 2*a* and 3*a*, connection between the semiconductor chips 2 and 3 is carried out between the portions of the internal circuits 2*a* and 3*a*. As a consequence, by using the semiconductor chips 2 and 3 whose reliability is sufficiently assured by the functional test, without going through the external connection circuits 2*b*' and 3*b*' employed for the functional test, it is possible to obtain a semiconductor device in which the semiconductor chips 2 and 3 are connected directly by the portions of the internal circuits 2*a* and 3*a*, namely, a semiconductor device capable of reducing power consumption and improving high-speed operation.

Especially, of the external connection circuits 2*b* and 3*b* provided on each of the semiconductor chips 12 and 13, those portions of the external connection circuits 2*b*' and 3*b*', which will become unnecessary after the functional test, are electrically cut off from the internal circuits 2*a* and 3*a*. At that time, the portions of the semiconductor chips 12 and 13 where the portions of the external connection circuits 2*b*' and 3*b*' are provided are cut off and are removed to obtain the semiconductor chips 2 and 3, hence, it becomes possible to miniaturize the semiconductor chips 2 and 3, leading to miniaturization of a semiconductor device.

Particularly, as described by referring to FIG. 5, if the external connection circuits 2*b*' and 3*b*' are shared by a plurality of signal lines 2*a*-1 (3*a*-1) which draw the internal circuits 2*a* and 3*a*, the functional test can be conducted by using fewer electrode pads 2*c* and 3*c* for testing.

Second Preferred Embodiment

Figure 6:
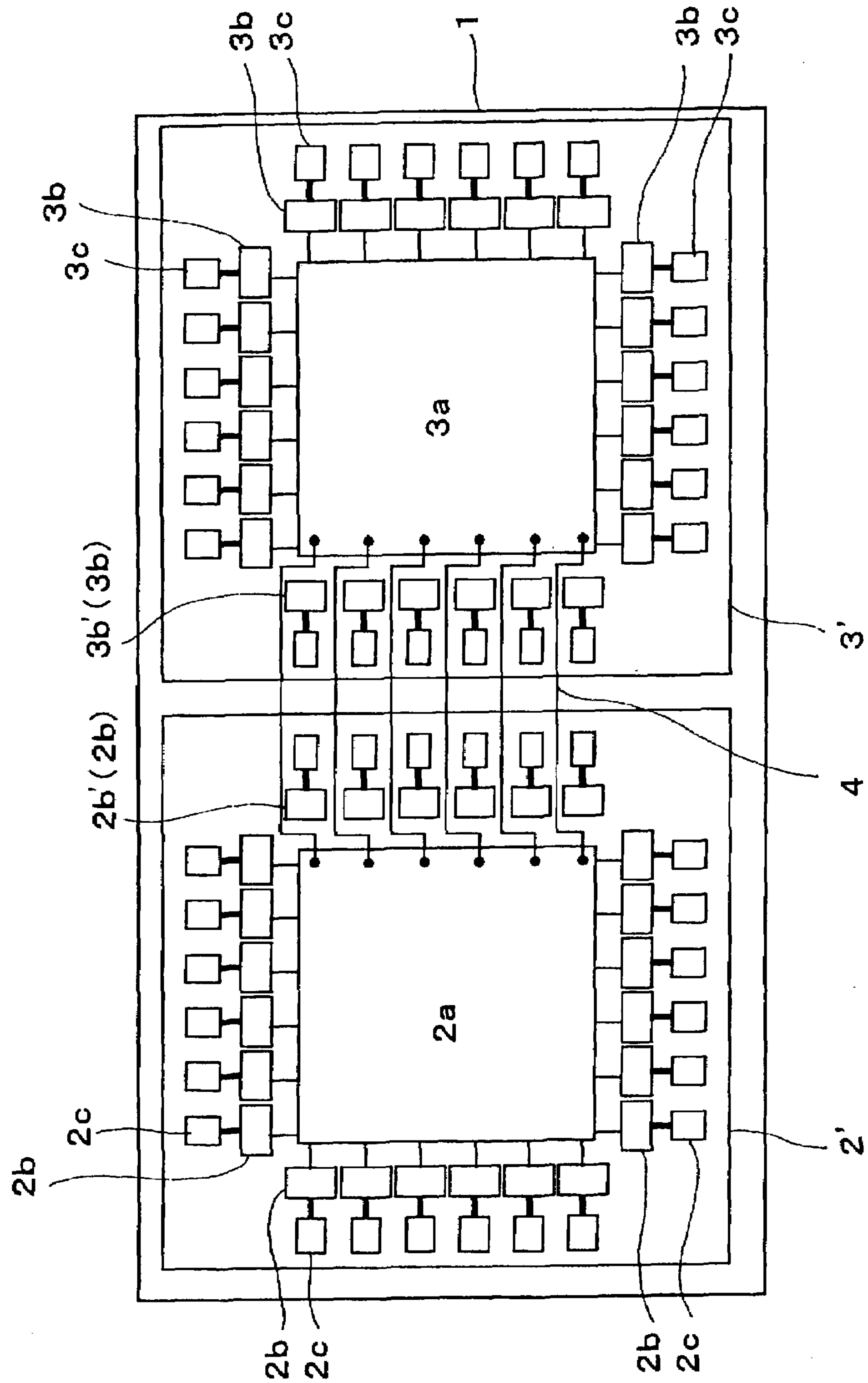
FIG. 6 is a plan view showing a construction of a semiconductor device according to a second embodiment of the present invention.

FIG. 6 is a plan view showing a second preferred embodiment of a semiconductor device according to the present invention. A difference between a semiconductor device illustrated in this drawing and a semiconductor device of a first preferred embodiment described by referring to FIG. 1 and FIG. 2 lies in a construction of semiconductor chips 2' and 3', construction of other parts being the same.

Namely, a characteristic feature of the semiconductor chips 2' and 3' used for the semiconductor device is that the external connection circuits 2*b*' and 3*b*' separated from the internal circuits 2*a* and 3*a* remain as they are on the semiconductor chips 2' and 3'. In other words, of the external connection circuits 2*b* and 3*b*, those portions of the external connection circuits 2*b*' and 3*b*' drawn from the portions of the internal circuits 2*a* and 3*a* which are connected to other semiconductor chips 2 and 3 on the supporting substrate 1 are electrically cut off from the internal circuits 2*a* and 3*a* but remain as they are. This is the same for the electrode pads 2*c* and 3*c*.

Further, the external connection circuits 2*b*' and 3*b*' may be, as described by referring to FIG. 5 in the first preferred embodiment, based on a construction shared by a plurality of signal lines 2*a*-1 (3*a*-1). In this case, at the point P on a circuit diagram shown in FIG. 5, that is, at the position where the electrode pads 2*a*-3 (3*a*-3) remain on the internal circuit 2*a* and 3*a* side, the external connection circuit 2*b*' and 3*b*', while in the state of being electrically cut off from the internal circuits 2*a* and 3*a*, remain as they are.

In a semiconductor device of the above-mentioned construction, it is so constructed that connection between the semiconductor chips 2 and 3 mounted on the supporting substrate 1 is carried out by way of a direct connection between the portions of the internal circuits 2*a* and 3*a* of the semiconductor chips 2 and 3 without going through the external connection circuits 2*b*' and 3*b*'. Further, the external connection circuits 2*b*' and 3*b*' are electrically cut off from the portions of the internal circuits 2*a* and 3*a*, so that, in a manner similar to the semiconductor device of the first preferred embodiment, as compared with a semiconductor device in which the internal circuits 2*a* and 3*a* of the semiconductor chips 2 and 3 are connected via the external connection circuits 2*b*' and 3*b*', this enables power consumption to be reduced and high-speed operation to be accomplished.

Next, a manufacturing method of a semiconductor device mentioned above will be described.

First, in the same manner as a first preferred embodiment described by referring to FIG. 4A, a functional test of each of the semiconductor chips 12 and 13 will be conducted. Thereafter, by dry etching such as laser blow-off or RIE (reactive ion etching), the external connection circuits 2*b*' and 3*b*' to be cut off are separated from the connecting portions of the internal circuits 2*a* and 3*a*. At this instant, it is preferable that the functional test and the laser blow-off of each of the semiconductor chips 12 and 13 be conducted in the state of a wafer on which a plurality of semiconductor chips 12 are provided as well as in the state of a wafer on which a plurality of semiconductor chips 13 are provided. Note that when cutting off by means of the laser blow-off, the same process as fuse blowing to cut off a circuit determined to be unacceptable in the functional test may be used.

Subsequent to completion of the functional test and the cut-off of the external connection circuits 2*b*' and 3*b*', in a manner similar to the first preferred embodiment, each wafer is split into each of the semiconductor chips 12 and 13, and only those chips determined by the result of the functional test to be acceptable are picked up. In this way, the semiconductor chips 2' and 3' of a construction explained by referring to FIG. 6 are obtained.

Thereafter, in a manner similar to the first preferred embodiment, die bonding of the semiconductor chips 2' and 3' is performed on the supporting substrate 1, and further the insulating film, the connection holes, and the wiring 4 are formed to obtain a semiconductor device illustrated in FIG. 6.

Despite the manufacturing method mentioned above, after the functional test of the internal circuits 2*a* and 3*a* is conducted by using a sufficient number of necessary pieces of the external connection circuits 2*b* and 3*b*, the unnecessary external connection circuits 2*b*' and 3*b*' are cut off from the internal circuits 2*a* and 3*a*, so that connection between the semiconductor chips 2 and 3 is carried out between the portions of the internal circuits 2*a* and 3*a*. As a consequence, in a manner similar to the first preferred embodiment, by using the semiconductor chips 2 and 3 whose reliability is sufficiently assured by the functional test, it is possible to obtain a semiconductor device capable of reducing power consumption and improving high-speed operation.

In particular, since cutting off of the external connection circuits 2*b*' and 3*b*' from the internal circuits 2*a* and 3*a* is carried out in the same process as the fuse blowing to cut off the circuit determined to be unacceptable in the functional test, it is possible to manufacture a semiconductor device without increasing steps for cutting off.

In the manufacturing method according to the present second preferred embodiment, the cutting off of the external connection circuits 2*b*' and 3*b*' from the internal circuits 2*a* and 3*a* has been explained in terms of a procedure in the state of a wafer. However, so long as this cut-off is carried out after the functional test and prior to mounting the semiconductor chips 2' and 3' on the supporting substrate 1 and covering such chips with an insulating film, it may be carried out at any timing.

Third Preferred Embodiment

Figure 7:
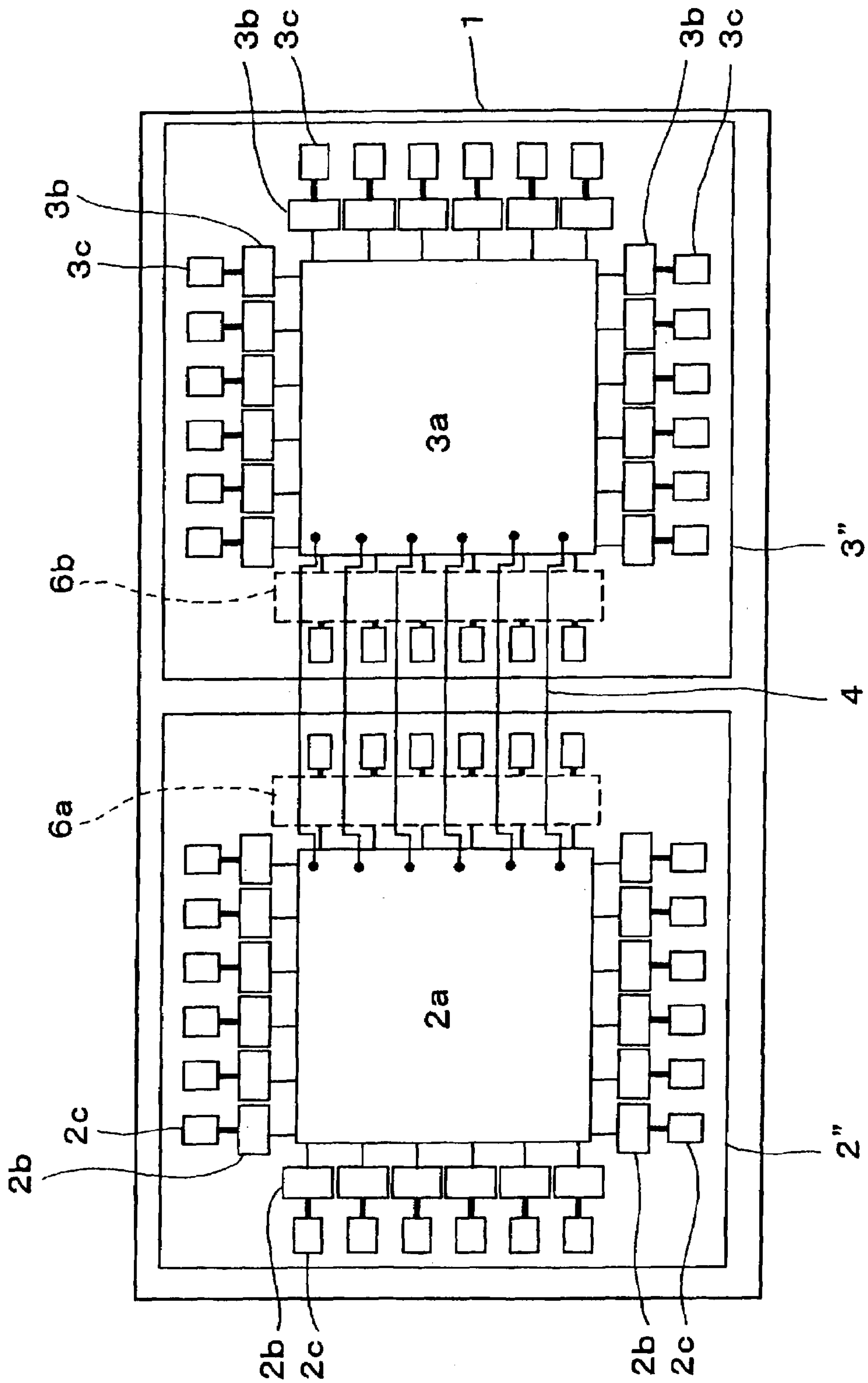
FIG. 7 is a plan view showing a construction of a semiconductor device according to a third embodiment of the present invention.

FIG. 7 is a plan view showing a third preferred embodiment of a semiconductor device according to the present invention. A difference between a semiconductor device illustrated in this drawing and the semiconductor device of the first preferred embodiment described by referring to FIG. 1 lies in a construction of a part of the external connection circuits set up on semiconductor chips 2" and 3".

Namely, on the semiconductor chips 2" and 3" used for the present semiconductor device, there are set up external connection circuits 2*b* and 3*b* similar to those described in the first preferred embodiment and the second preferred embodiment. Also, on those portions drawn from the portions of the internal circuits 2*a* and 3*a* connected to the other semiconductor chips 2" and 3" which are mounted on the supporting substrate 1, there are set up external circuits 6*a* and 6*b*, each provided with an external connection circuit and a separating circuit. Further, by means of the wiring 4 set up between internal circuits 2*a* and 3*a*, direct connection is carried out between the semiconductor chips 2" and 3".

Figure 8A:
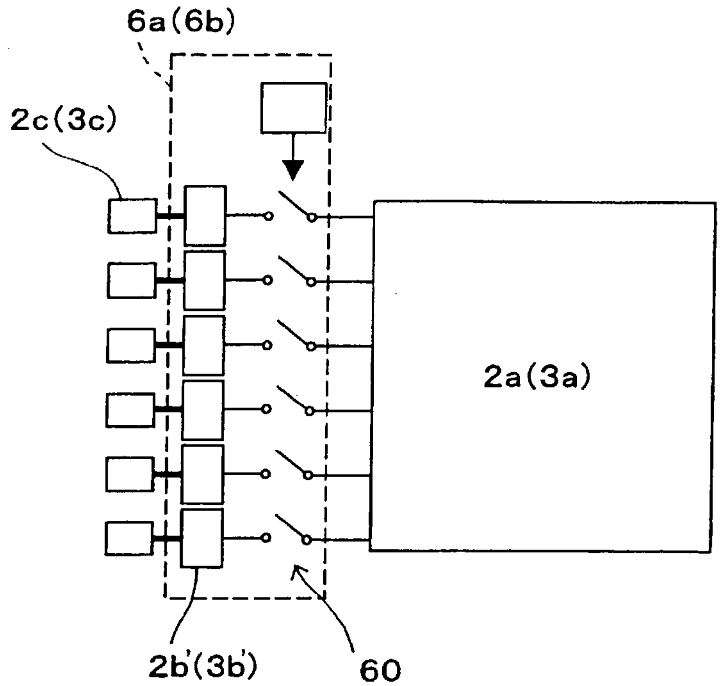
FIG. 8, consisting of FIGS. 8A and 8B, shows a block diagram and a circuit diagram of an external circuit provided in a semiconductor device according to the third embodiment.
Figure 8B:
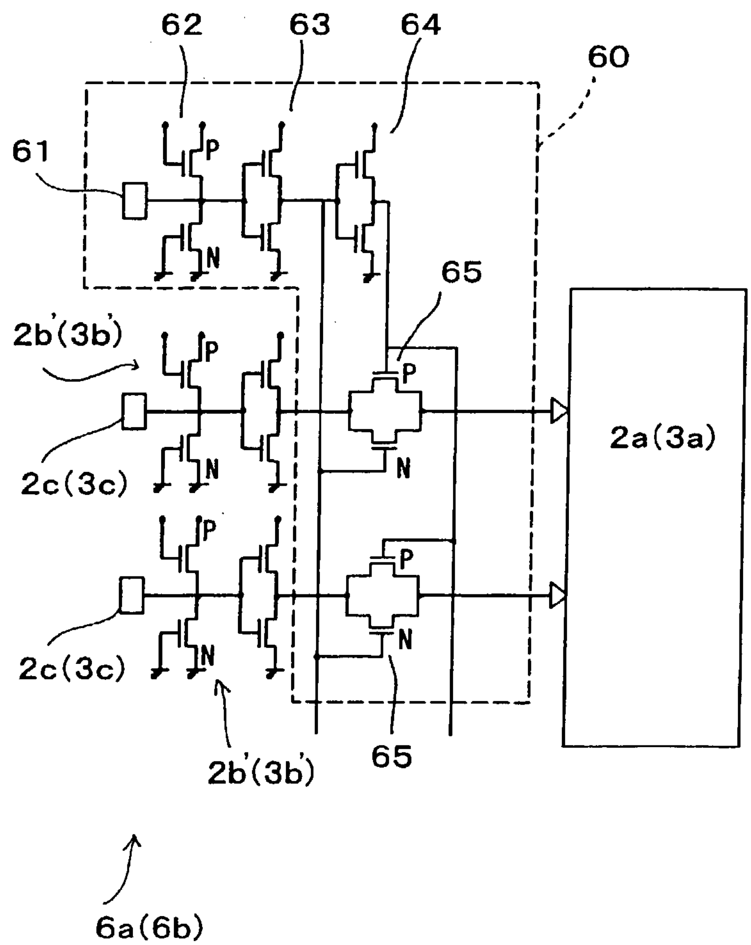

FIG. BA shows a block diagram of a principal part of the semiconductor chips 2" and 3" having these external circuits 6*a* and 6*b*, and FIG. 8B shows an example of a construction of the external circuits 6*a* and 6*b*. In FIG. 8B, P indicates a P-type semiconductor and N indicates an N-type semiconductor.

As shown in FIG. 8A, the external circuits 6*a* and 6*b* include the external connection circuits 2*b*' and 3*b*' and a separating circuit 60 connected to these external connection circuits 2*b*' and 3*b*'. The external connection circuits 2*b*' and 3*b*', being of the similar construction to the external connection circuits 2*b* and 3*b* of another part, are drawn from the internal circuits 2*a* and 3*a*, and further connected to the electrode pads 2*c* and 3*c*. The separating circuit 60 is set up, for example, as a changeover switch of a connection status between the external connection circuits 2*b*' and 3*b*' and the internal circuits 2*a* and 3*a* in accordance with an outside signal.

As shown in FIG. 8B, the separating circuit 60 has, for example, an electrode pad 61 for connection to the outside, and to this electrode pad 61 are serially connected inverter circuits 63 and 64 via a protection circuit 62. In addition, it is so constructed that between each of the external connection circuits 2*b*' and 3*b*' and each of the internal circuits 2*a* and 3*a*, respective switches 65 are inserted, and inverter circuits 63 and 64 are connected in parallel to these switch circuits 65.

In the separating circuit 60 mentioned above, changeover of the connection status between the external connection circuits 2*b*' and 3*b*' and the internal circuits 2*a* and 3*a* is performed by inputting a signal from the electrode pad 61.

In a semiconductor device of such a construction, without going through the external connection circuits 2*b*' and 3*b*', connection is established between the semiconductor chips 2" and 3" mounted on the supporting substrate 1 by direct wiring to the portions of the internal circuits 2*a* and 3*a* of the semiconductor chips 2 and 3. Also, relative to the portions of the internal circuits 2*a* and 3*a*, the external connection circuits 2*b*' and 3*b*' are electrically separable by the separating circuit 60. Hence, in the same way as a semiconductor device of a first preferred embodiment, by comparison with a semiconductor device in which connection is established between the internal circuits of the semiconductor chips via the external connection circuits, reduction of power consumption and high-speed operation can be accomplished.

Furthermore, by the separating circuit 60, electrical separation of the part of the external connection circuits 2*b*' and 3*b*' to be connected to the internal circuits 2*a* and 3*a* is carried out. As a result, for example, at the time of the functional test of the internal circuits 2*a* and 3*a*, if the external connection circuits 2*b*' and 3*b*' are needed, these circuits can be connected. On the other hand, if the external connection circuits 2*b*' and 3*b*' are not needed, the external connection circuits 2*b*' and 3*b*' are cut off to prevent a current from running into the unnecessary external connection circuits 2*b*' and 3*b*', thus making it possible to assure reduction of power consumption.

Moreover, a construction including such a separating circuit is applicable to a construction in which a plurality of signal lines 2*a*-1 (3*a*-1) share the external connection circuits 2*b*' (3*b*') as explained in the first preferred embodiment by referring to FIG. 5. In this case, between the internal circuits including the electrode pads 2*a*-3 (3*a*-3) shown in FIG. 5 and the external connection circuits 2*b*' and 3*b*', there is set up the separating circuit 60 as explained by referring to FIG. 8B.

Next, a manufacturing method of such a semiconductor device will be described.

First, there are fabricated the internal circuits 2*a* and 3*a*, the external connection circuits 2*b* and 3*b*, and the electrode pads 2*c* and 3*c*. At the same time, the semiconductor chips 2" and 3" provided with the above-mentioned external circuits 6*a* and 6*b* are fabricated.

Further, while the status is that of connecting the external connection circuits 2*b*' and 3*b*' in the external circuits 6*a* and 6*b* to the internal circuits 2*a* and 3*a* by means of the separating circuit 60, in a manner similar to the description with regard to the first preferred embodiment by referring to FIG. 4A, the functional test of each of the semiconductor chips 2" and 3" is carried out. At this instant, it is preferable that the functional test of each of the semiconductor chips 2" and 3" be carried out in the state of a wafer on which a plurality of semiconductor chips 2" are provided as well as in the state of a wafer on which a plurality of semiconductor chips 3" are provided.

Then, each of the semiconductor chips 2" and 3" formed on each wafer are determined to be either acceptable or not. Thereafter, the back side of each wafer is ground and is split into each of the semiconductor chips 2" and 3", and only those chips determined by the result of the functional test to be acceptable are picked up. As a result, the semiconductor chips 2" and 3" of a construction explained by referring to FIG. 7 and FIG. 8 are obtained.

Next, the separating circuit 60 separates the connection between the internal circuits 2*a* and 3*a* and the external connection circuits 2*b*' and 3*b*' in the semiconductor chips 2" and 3" after the functional test.

Next, in a manner similar to the first preferred embodiment, the semiconductor chips 2" and 3" are subjected to die bonding on the supporting substrate 1 and further forming an insulating film, connection holes, and the wiring 4, whereby a semiconductor device shown in FIG. 7 is obtained.

Further, in the manufacturing method mentioned above, a process of separating the status of connection between the internal circuits 2*a* and 3*a* and the external connection circuits 2*b*' and 3*b*' by means of the separating circuit 60 may be performed in the state of wafer prior to splitting the semiconductor chips 2" and 3" or after the die bonding of the semiconductor chips 2" and 3" on the supporting substrate 1.

In a manufacturing method mentioned above, after the functional test of the internal circuits 2*a* and 3*a* is conducted by using a sufficient number of necessary pieces of the external connection circuits 2*b* (2*b*') and 3*b* (3*b*'), unnecessary external connection circuits 2*b*' and 3*b*' (the external connection circuits in the external circuits 6*a* and 6*b*) are cut off from the internal circuits 2*a* and 3*a* by the separating circuit 60. As a consequence, in a manner similar to the manufacturing method of the first preferred embodiment, by using the semiconductor chips 2 and 3 whose reliability is sufficiently assured by the functional test, it is possible to obtain a semiconductor device capable of reducing power consumption and improving high-speed operation.

In a manufacturing method according to the present third preferred embodiment, cut-off of the external connection circuits 2*b*' and 3*b*' by the separating circuit 60 was explained in terms of procedures of carrying out in the state of a wafer. However, so long as this cut-off is performed after the functional test and prior to covering the semiconductor chips 2" and 3" with an insulating film, it may be carried out at any timing.

Further, the external circuits 6*a* and 6*b* and the separating circuit 60 described in the present third preferred embodiment are just an example and not limited to a construction explained by referring to FIG. 8. Still further, in the present third preferred embodiment, the separating circuit 60 which operates the status of connection of the external connection circuit 2*b*' and 3*b*' relative to the internal circuits 2*a* and 3*a* by means of an outside signal from the electrode pad 61 was described in terms of a construction having the external circuits 6*a* and 6*b*. Nevertheless, the separating circuit 60 is not limited to such construction. For example, when the internal circuits 2*a* and 3*a* are connected by the wiring 4, there may be set up a separating circuit 60 which is so constructed as to automatically detect the connection and cut off the external connection circuits 2*b*' and 3*b*' of the external circuits 6*a* and 6*b* from the internal circuits 2*a* and 3*a*.

Furthermore, in the second preferred embodiment and the third preferred embodiment mentioned above, there was explained a construction in which all the external connection circuits 2*b*'and 3*b*, drawn from the portions of the internal circuits 2*a* and 3*a* which are connected to another semiconductor chip (the semiconductor chip 3 in the case of the semiconductor chip 2, and the semiconductor chip 2 in the case of the semiconductor chip 3) were electrically cut off from the internal circuits 2*a* and 3*a*.

Nonetheless, it should be pointed out that according to the present invention, it is sufficient if at least a part of the external connection circuits 2*b*' and 3*b*' drawn from the portions of the internal circuits 2*a* and 3*a* connected to the other semiconductor chips 2 and 3 or a part of the circuits constituting these external connection circuits 2*b*' and 3*b*' is cut off from the internal circuits 2*a* and 3*a*.

Figure 2:
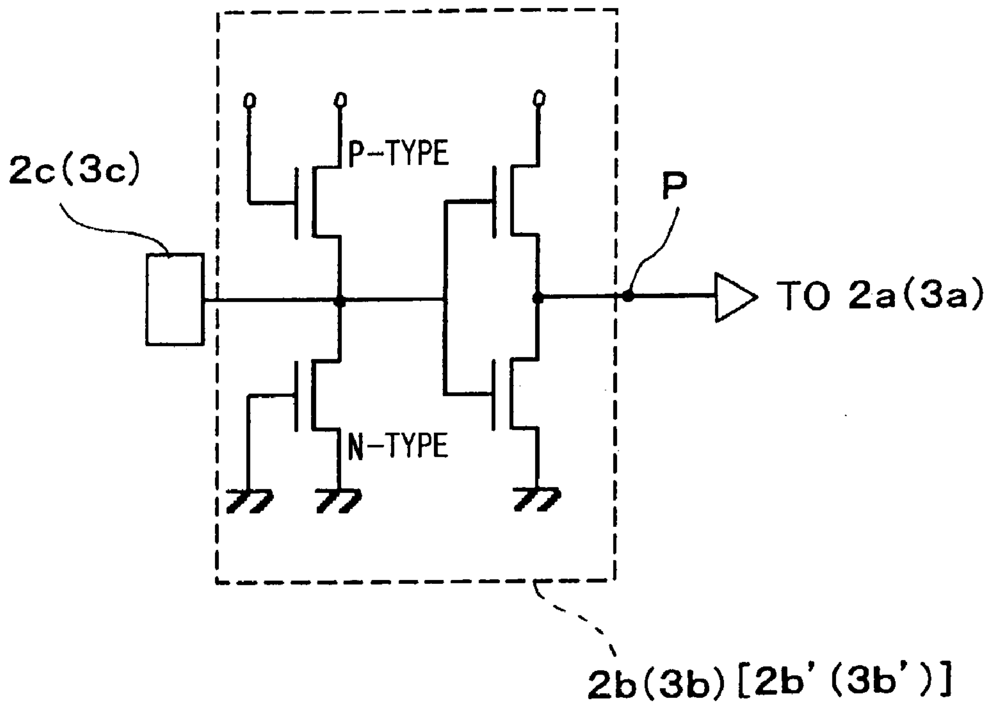
FIG. 2 is a circuit diagram showing an example of a construction of an external connection circuit.

For example, the external connection circuits 2*b* and 3*b* according to each preferred embodiment, as shown in a circuit diagram of FIG. 2, is constituted by the I/O circuit, the power circuit (power terminal), the electrostatic protection circuit, and the like, with a part of the external connection circuits 2*b*' and 3*b*' to be cut off from the internal circuits 2*a* and 3*a* at the point P. However, the point of cutting off from the internal circuits 2*a* and 3*a* may be between the I/O circuit and the electrostatic protection circuit or among the I/O circuit, the electrostatic protection circuit, and the power terminal. Even if the cut-off from the internal circuits 2*a* and 3*a* is carried out at such an area, a current is prevented from running into the cut-off portions of the external connection circuits; therefore, it is possible to bring about the reduction of power consumption. Moreover, such construction is similarly applicable to the first preferred embodiment.

Fourth Preferred Embodiment

Figure 9A:
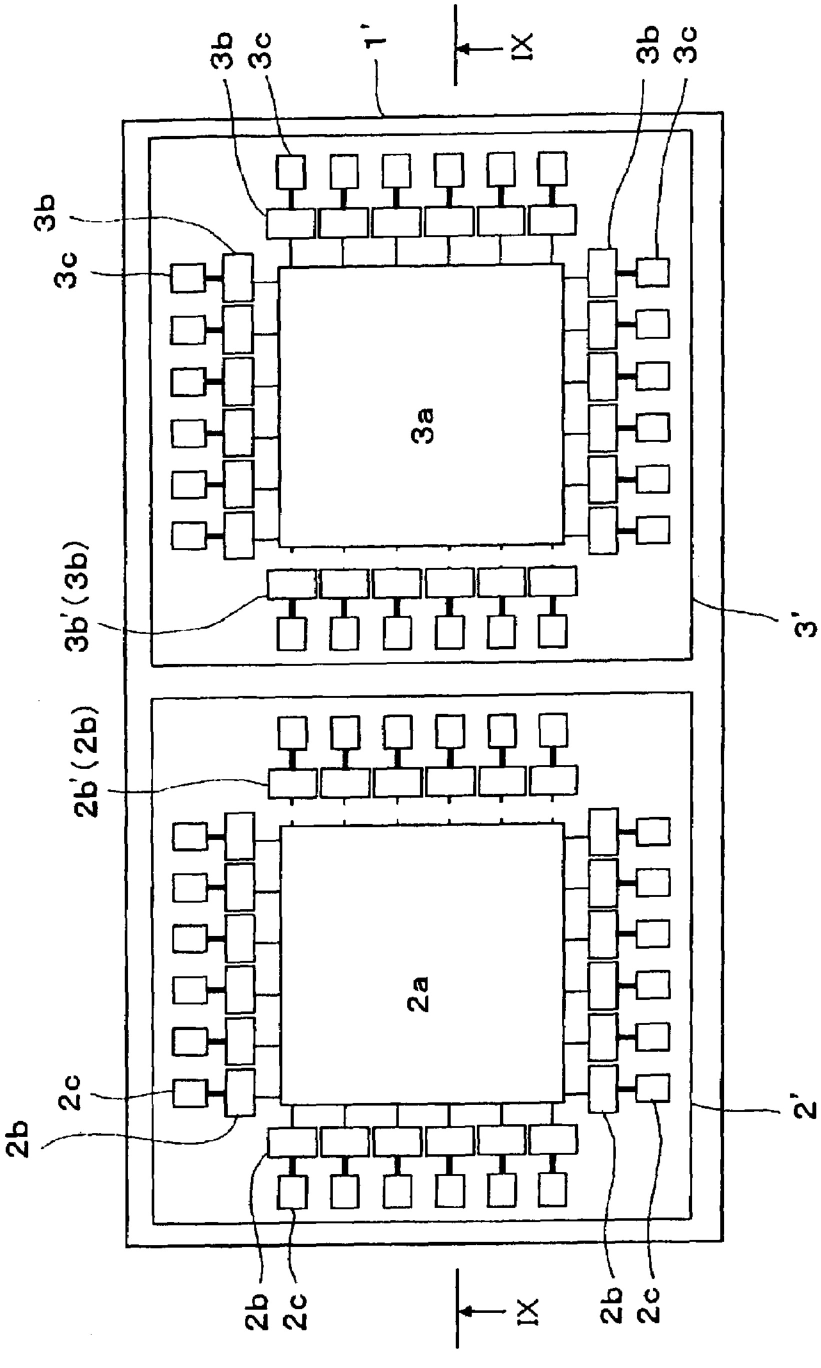
FIG. 9, consisting of FIGS. 9A and 9B, show a plan view and a cross-sectional view of a construction of a semiconductor device according to a fourth embodiment of the present invention.
Figure 9B:
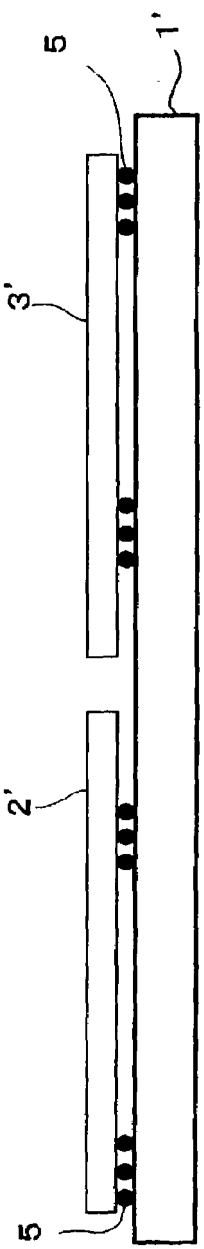
Figure 10:
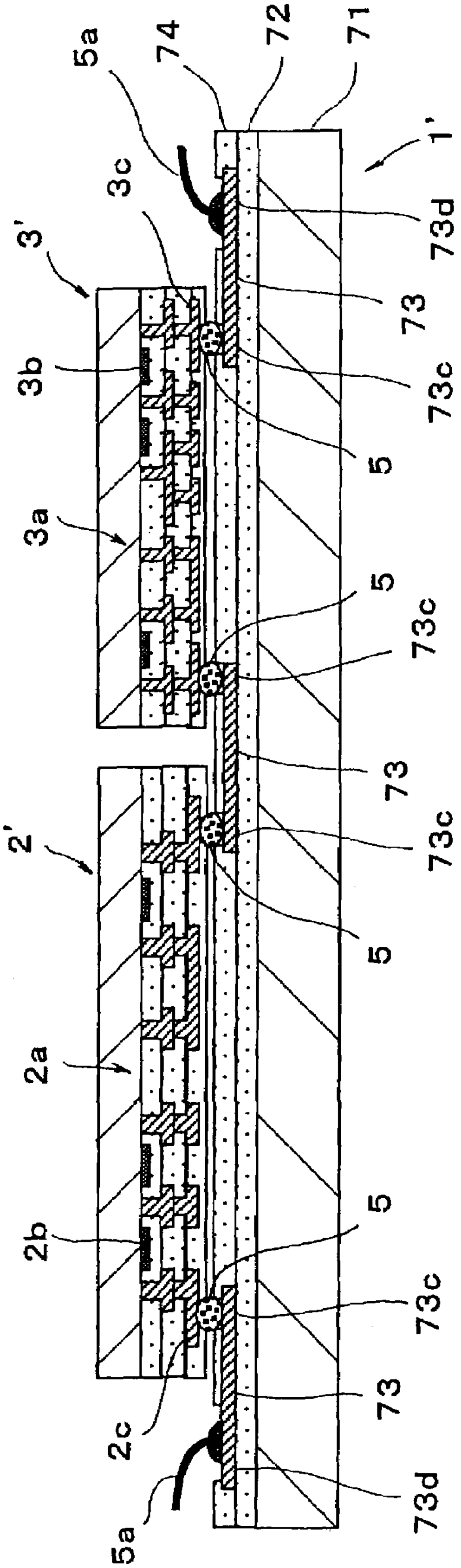
FIG. 10 is a cross-sectional view showing a detailed construction of a semiconductor device according to the fourth embodiment.

FIG. 9A is a plan view showing a fourth preferred embodiment of a semiconductor device according to the present invention, and FIG. 9B is a sectional view along line IX—IX in this plan view. Also, FIG. 10 is a detailed sectional view of a cross section of FIG. 9B.

A difference between a semiconductor device in these drawings and the previously shown semiconductor devices in the first to third preferred embodiment lies in a fact that the semiconductor chips 2' and 3' are mounted facing down, other elements of construction being similar. Further, description will be made by illustrating the semiconductor chips 2' and 3' as explained in a second preferred embodiment with reference to FIG. 6 as representing the face down mounting. When the semiconductor chips 2 and 3 explained in a first preferred embodiment as well as the semiconductor chips 2" and 3" explained in the third preferred embodiment are subjected to face down mounting, the similar procedures as described herein for the present preferred embodiment are applicable.

Namely, in this semiconductor device, the semiconductor chips 2' and 3' are mounted facing down on the supporting substrate (so-called interposer) 1' via protruding electrodes 5. This supporting substrate 1' is made by forming wiring 73 in high density, for example, on a silicon substrate 71 via an insulating film 72. Further, a part of the wiring 73 is formed in the shape of an electrode pad, and it is so constructed that only these portions of electrode pads 73*c* and 73*d* are exposed, while the other part of the wiring 73 is covered by an insulating film 74.

The electrodes 73*c* herein are electrode pads to carry out connection of the semiconductor chips 2' and 3' to the supporting substrate 1'. On the other hand, the electrode pads 73*d* are electrode pads to carry out connection of the supporting substrate 1' to external equipment; for example, they are arranged in the outer periphery of the supporting substrate 1'.

Now, connection between the semiconductor chips 2' and 3' is carried out by the protruding electrodes 5 and the wiring 73 of the supporting substrate 1' connected by the protruding electrodes 5. The protruding electrodes 5*a* are held between a part of the wiring constituting the internal circuits 2*a* and

3*a* of each of the semiconductor chips 2' and 3', for example, a portion created by forming a part of the uppermost layer of multi-layer wiring as illustrated into an electrode pad shape as well as the electrode pads 2*a*-3 (3*a*-3) shown in FIG. 5, and the electrode pads 73*c* of the supporting substrate 1', whereby a direct connection is carried out between the internal circuits 2*a* and 3*a* of each of the semiconductor chips 2' and 3' without going through the external connection circuits such as the I/O circuit.

Further, to carry out between the semiconductor chips 2' and 3' and external equipment, the electrode pads 2*c* and 3*c* provided on the semiconductor chips 2' and 3' are also connected to the electrode pads 73*c* of the wiring 73 formed on the supporting substrate 1' side via the protruding electrodes 5. The wiring 73 to which the electrode pads 2*c* and 3*c* are connected is drawn to the outer periphery of the supporting substrate 1', and the external electrode pads 73*d* to carry out an external connection are provided on a drawn portion of the wiring.

These electrode pads 2*c* and 3*c* are connected to the internal circuits 2*a* and 3*a* of the semiconductor chips 2' and 3' via the external connection circuits 2*b* and 3*b* such as the I/O circuit, whereby a direct connection is carried out between the internal circuits 2*a* and 3*a* of the semiconductor chips 2' and 3' and the external electrode pads 73*d* of the supporting substrate 1' by going through the external connection circuit 2*b* such as the I/O circuit.

In a semiconductor device of such construction, connection to external equipment is carried out by connecting the external electrode pads 73*d* to bonding wires 5*a*. It is also noted that the external electrode pads 73*d* are used for conducting a test on a multi-chipped semiconductor device as well.

Next, a manufacturing method of such a semiconductor device will be described.

First, in a manner similar to the second preferred embodiment, the semiconductor chips 2' and 3' are obtained. Then, in the semiconductor chips 2' and 3', the protruding electrodes 5 are formed on the electrode pads 2*c* and 3*c* where the status of connection to the internal circuits 2*a* and 3*a* is maintained and on the portions of the internal circuits 2*a* and 3*a* which will serve as connecting portions with other semiconductor chips. Further, it is preferable for the protruding electrodes 5 to be formed while in the state of a wafer prior to splitting into the semiconductor chips 2' and 3'. Furthermore, the formation of the protruding electrodes 5 needs not be on the side of the semiconductor chips 2' and 3' but may be on the supporting substrate 1' side.

After the above-mentioned procedures, the semiconductor chips 2' and 3' are mounted on the supporting substrate 1', on which the wiring 73 and the electrode pads 73*c* and 73*d* are formed, with the surfaces formed of the internal circuits 2*a* and 3*a* facing each other. At this instant, via the wiring 73 of the supporting substrate 1' and the protruding electrodes 5, direct connection between the internal circuits 2*a* and 3*a* of the semiconductor chips 2' and 3' is carried out, thus completing the manufacture of a semiconductor device.

Despite a semiconductor device and its manufacturing method as mentioned above, the wiring 73 on the supporting substrate 1' side directly connects between the internal circuits 2*a* and 3*a* of the semiconductor chips 2' and 3', so that in a manner similar to the first to the third preferred embodiment mentioned above, by using the semiconductor chips 2' and 3' whose reliability has been sufficiently assured by the functional test, it is possible to obtain a semiconductor device capable of reducing power consumption and improving high-speed operation.

Further, in a semiconductor device according to the fourth preferred embodiment, when the silicon substrate 71 is used for the supporting substrate 1', formation of high density wiring 73 to the supporting substrate 1' side becomes possible, thus enabling a space between the semiconductor chips 2' and 3' to be connected in the shortest distance. From this, too, further prevention of signal delay and higher-speed operation become possible.

Still further, when a silicon substrate is used for both the supporting substrate 1' and the semiconductor chips 2' and 3', because of the equal coefficient of expansion of both, occurrence of the breaking of wire at a junction (due to the protruding electrodes 5) caused by thermal stress can be prevented. Furthermore, by using a silicon substrate of high thermal conductivity as compared to any organic substrate for the supporting substrate 1', even if the semiconductor chips 2' and 3' should heat up as driven by the internal circuits 2*a* and 3*a*, it is possible to radiate such heat more quickly. Hence, faulty operation due to generation of heat can be prevented.

Fifth Preferred Embodiment

Figure 11:
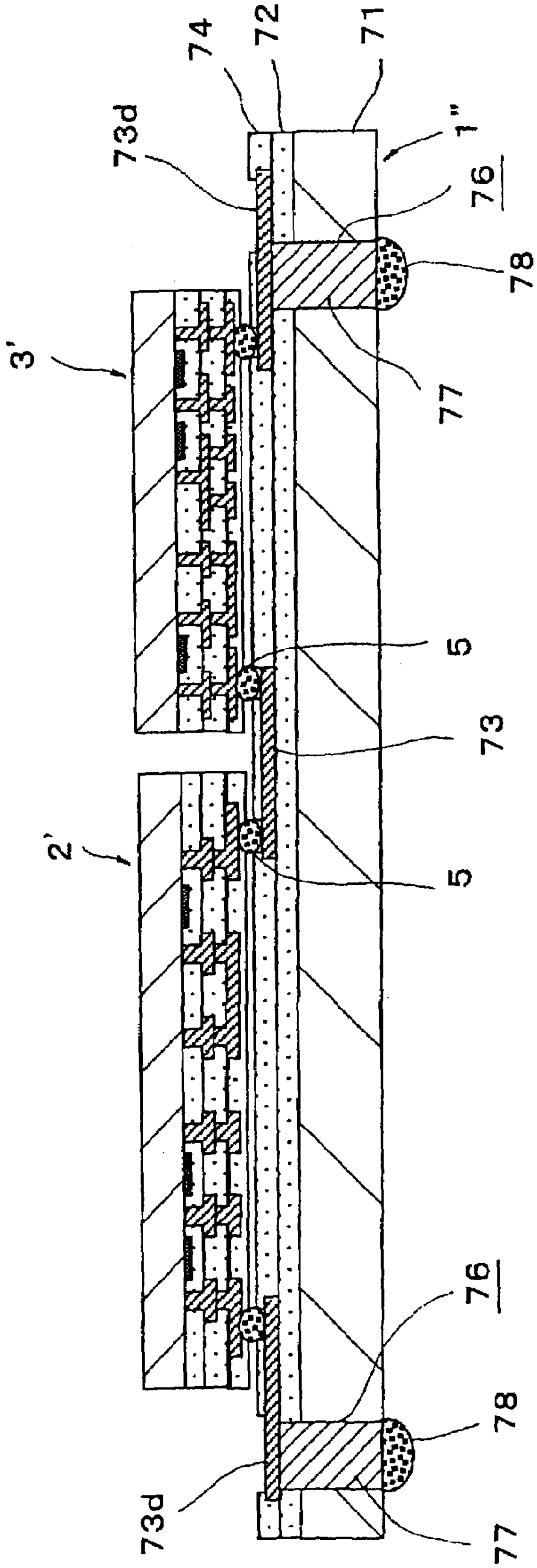
FIG. 11 is a cross-sectional view showing a detailed construction of a semiconductor device according to a fifth embodiment of the present invention.

FIG. 11 is a cross-sectional view of a fifth preferred embodiment of a semiconductor device according to the present invention. A difference between a semiconductor device illustrated in this drawing and a semiconductor device of the fourth preferred embodiment lies in a construction of its supporting substrate 1", construction of other parts being the same.

Namely, the supporting substrate 1" is different from the supporting substrate 1' of the fourth preferred embodiment as described by referring to FIG. 10 in that external substrate connection holes 76 reaching the external electrode pads 73*d* are provided on the silicon substrate 71 and the insulating film 72. In the external substrate connection holes 76 are embedded plugs 77 comprised of a conductive material, and on the surface of the plugs 77 (surface on the silicon substrate 71 side) are set up protruding electrodes 78 for connecting the semiconductor device to external equipment.

Additionally, the protruding electrodes 78 are also used for testing a multi-chipped semiconductor device. Also, the surface of the external electrode pads 73*d* may be exposed from the insulating film 74 as illustrated or covered by the insulating film 74.

A semiconductor device of the construction mentioned above and its manufacturing method provides the same effect as the fourth preferred embodiment.

Sixth Preferred Embodiment

Figure 12:
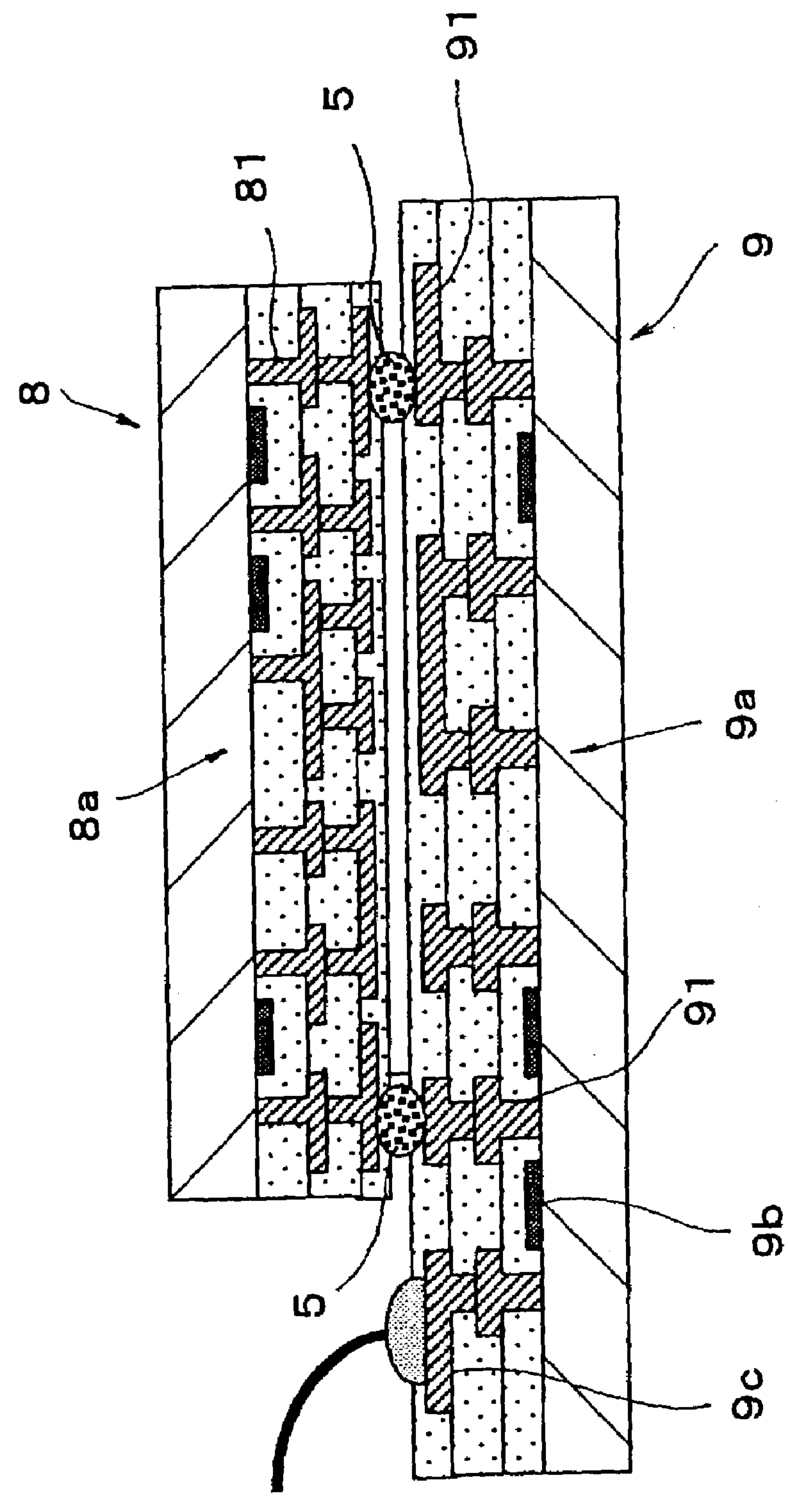
FIG. 12 is a cross-sectional view showing a detailed construction of a semiconductor device according to a sixth embodiment of the present invention.
Figure 13:
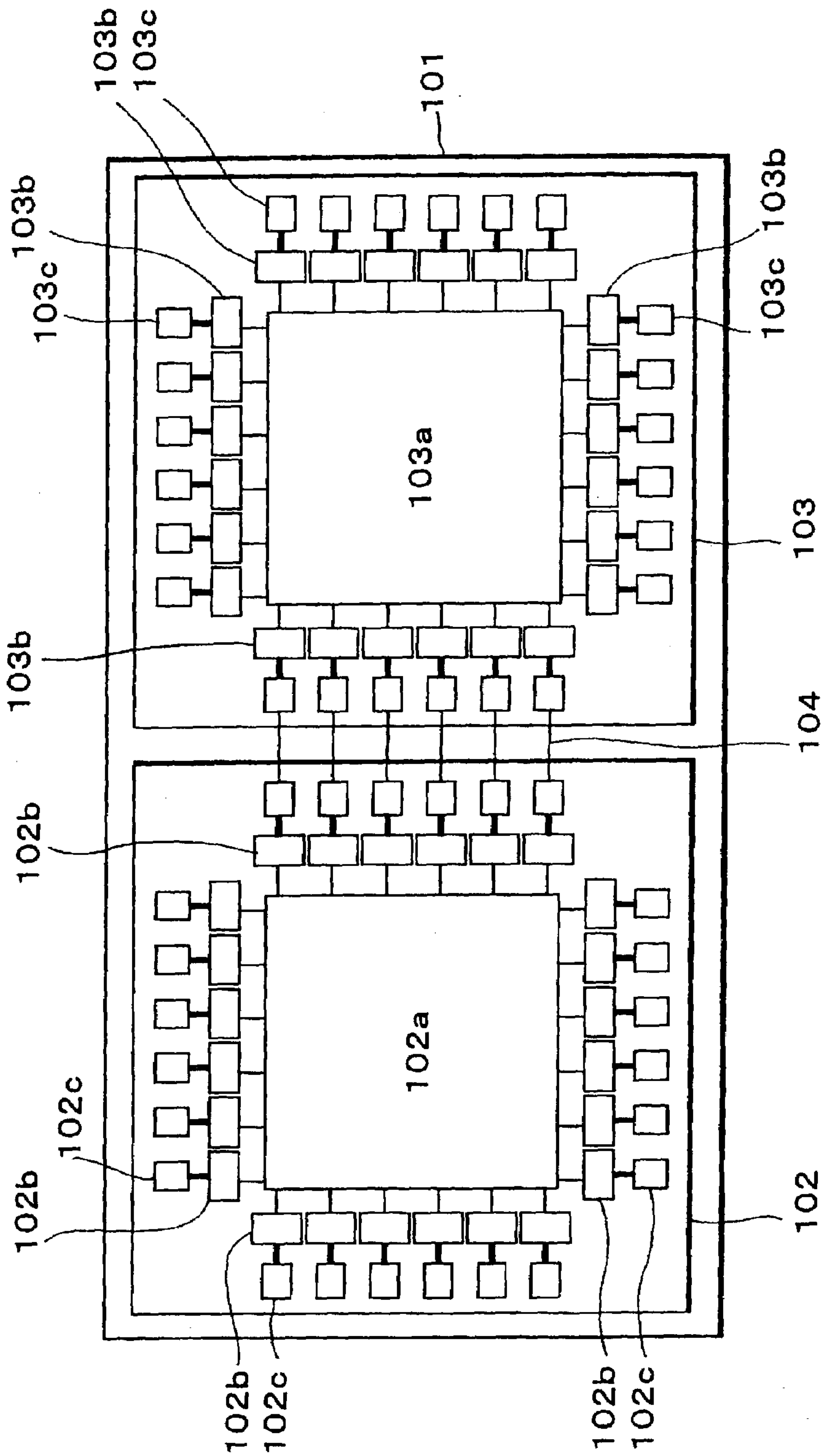
FIG. 13 shows a plan view and a cross-sectional view of a construction of a conventional semiconductor device.

FIG. 12 is a cross-sectional view showing a sixth preferred embodiment of a semiconductor device according to the present invention. A difference between the semiconductor device illustrated in this drawing and a semiconductor device according to the first to the fifth preferred embodiment is that the semiconductor chips 8 and 9 are mounted facing down. Namely, in this semiconductor device, the semiconductor chip 8 becomes a supporting substrate of the semiconductor chip 9 while the semiconductor chip 9 is a supporting substrate of the semiconductor chip 8, and these chips are mounted facing down via the protruding electrodes 5.

In this case, the semiconductor chip 8 is a semiconductor chip for logic having, as an internal circuit, for example, a logic circuit for signal processing and a signal control circuit for reading an optical disk. On the other hand, the semiconductor chip 9 is a semiconductor chip for memory having, as an internal circuit, for example, a 32-bit bus DRAM circuit. It should be pointed out that the construction of the internal circuit of the semiconductor chips 8 and 9 is not limited to what is mentioned above.

The semiconductor chip 8 is, for example, constituted only with an internal circuit 8*a*, and the portion of the internal circuit connected to the semiconductor chip 9 via the protruding electrodes 5 form part of wiring 81 comprising the internal circuit 8*a* (for example, part of the uppermost layer in the illustrated multi-layer wiring) in the shape of an electrode pad, thereby providing a sufficient area for connection.

Further, the semiconductor chip 9 includes an internal circuit 9*a*, a plurality of external connection circuits 9*b* drawn therefrom, and electrode pads 9*c* connected to the external connection circuits 9*b*. Among these, a part of wiring 91 (for example, part of the uppermost layer in the illustrated multi-layer wiring) constituting an internal circuit 9*a* is formed in the shape of an electrode pad, and connection with the semiconductor chip 8 is established at this part via the protruding electrodes 5.

In addition, external connection circuits 9*b* drawn from the internal circuit 9*a* are constituted with, for example, the I/O circuit, the power circuit, the electrostatic protective circuit, and the like in a manner as described by referring to FIG. 2 or FIG. 3 in the first preferred embodiment. Also, the electrode pad 9*c* connected to each external connection circuit 9*b* carries out connection between a semiconductor device packed with these semiconductor chips 8 and 9 and external equipment, being arranged on the outer periphery side of the semiconductor chip 9.

As the above-mentioned explanation shows, in this semiconductor device, the internal circuits 8*a* and 9*a* of the semiconductor chips 8 and 9 are mutually directly connected by embracing the protruding electrodes 5 between portions, formed in the shape of an electrode pad, of a part of the wiring 81 and 91 (for example, a part of the uppermost layer in the illustrated multi-layer wiring) constituting the internal circuits 8*a* and 9*a* of each of the semiconductor chips 8 and 9, without going through the external connection circuits such as the I/O circuit.

Now, a manufacturing method of such a semiconductor device will be described.

First, in the same way as described by referring to FIG. 4A in a first preferred embodiment, each semiconductor chip, in which the internal circuits, the external connection circuits, and the electrode pads are respectively formed, is fabricated on the surface of a wafer as a prior piece of the semiconductor chips 8 and 9 in FIG. 12. In regard to each semiconductor chip, a needle is applied to each electrode pad to conduct a functional test of each internal circuit. Thereafter, the wafer is split into each of the semiconductors 8 and 9 as shown in FIG. 12, and only those determined to be acceptable in the functional test are picked up.

When splitting a wafer into each of the semiconductor chips 8 and 9, a necessary part of the semiconductor chip formed on the wafer surface is left and other parts are cut off and removed. For example, out of the semiconductor chip which will become the prior piece of the semiconductor chip 8, the external connection circuits and the electrode pads are cut off and removed to obtain the semiconductor chip consisting only of the internal circuit 8*a*.

Further, out of the semiconductor chip which will become the prior piece of the semiconductor chip 9, only the internal circuit 9*a*, a necessary part of the external connection circuits 9*b* and the electrode pads 9*c* connected thereto remain, and the other parts are cut off and removed to obtain the semiconductor chip 9.

Then, in this semiconductor chip 8 (or the semiconductor chip 9), the protruding electrodes 5 are formed on a portion in the shape of an electrode pad of wiring constituting the internal circuit 8*a* (or the internal circuit 9*a*). It is preferable that formation of the protruding electrodes 5 be carried out in the wafer state prior to splitting the wafer into the semiconductor chips 8 and 9.

Subsequently, the semiconductor chip 8 and the semiconductor chip 9 are so arranged that the surfaces formed of the internal circuits 8*a* and 9*a* lie opposite to each other, and the semiconductor chip 8 is mounted on the semiconductor chip 9 via the protruding electrodes 5. At this instant, direct connection between the internal circuits 8*a* and 9*a* of the semiconductor chips 8 and 9 is established via the protruding electrodes 5, thus completing the manufacture of a semiconductor device.

Despite a semiconductor device of a construction as mentioned above and its manufacturing method, there is direct connection between the internal circuits 8*a* and 9*a* of the semiconductor chips 8 and 9, without going through the external connection circuits such as the I/O circuit, therefore, in a manner similar to the first to the fifth preferred embodiments mentioned above, by using the semiconductor chips 2' and 3' whose reliability has been sufficiently assured by the functional test, it is possible to obtain a semiconductor device capable of reducing power consumption and improving high-speed operation.

Further, according to the present sixth preferred embodiment, use of the semiconductor chip 8 (or the semiconductor chip 9) as its supporting substrate dispenses with a so-called interposer, therefore, a low cost MCM without the interposer's cost can be realized.

Still further, in the present sixth preferred embodiment, a construction of arranging one semiconductor chip 8 opposite one semiconductor chip 9 has been illustrated by example, but is not limited thereto. For example, there can be a construction having the semiconductor chip 9 as its supporting substrate with a plurality of semiconductor chips 8 mounted thereon or a reverse of such construction. A plurality of semiconductor chips to be mounted on one semiconductor chip may have either different functions or an internal circuit of the same function.

Furthermore, in the present sixth preferred embodiment, it has been described that the semiconductor chips 8 and 9 are constituted with the external functional circuits and the electrode pads only necessary for the functional test conducted during the manufacturing process, which will be cut off and removed. However, the semiconductor chips 8 and 9 may be of such a construction that these external functional circuits and the electrode pads all remain; for example, the same construction of the semiconductor chips 2' and 3' as explained by referring to FIG. 6 in a second preferred embodiment may be applied. Also, it may be of the same construction as the semiconductor chips 2" and 3" as explained by referring to FIG. 7 in a third preferred embodiment. Manufacturing a semiconductor device using semiconductor chips of the second preferred embodiment or the third preferred embodiment includes processes other than the process of mounting via the protruding electrodes, which are to be carried out in a manner similar to the second preferred embodiment and the third preferred embodiment.

What is claimed is:

1. A semiconductor device, comprising:

a plurality of semiconductor chips, each having an internal circuit and an external connection circuit drawn therefrom, said plurality of semiconductor chips being mounted on a same supporting substrate, wherein a connection between each of the semiconductor chips mounted on said supporting substrate is established at a portion between said internal circuits of said plurality of semiconductor chips, said connection is established through wiring formed on said supporting substrate; and wherein in at least one of said semiconductor chips mounted on said supporting substrate, at least a part of the circuit constituting said external connection circuit is drawn from said internal circuit that is connected to another adjacent semiconductor chip, and a separating circuit electrically cuts-off said part of said external connection circuit from said internal circuit.

2. The semiconductor device according to claim 1, further including a method of making said semiconductor device as claimed.

* * * * *